United States Patent [19]

Sharrit

[11] 4,092,567
[45] May 30, 1978

[54] METHOD AND CIRCUIT FOR GENERATING DIAMOND MARKERS

[75] Inventor: David D. Sharrit, Santa Rosa, Calif.

[73] Assignee: Hewlett-Packard Company, Palo Alto, Calif.

[21] Appl. No.: 667,778

[22] Filed: Mar. 17, 1976

[51] Int. Cl.² .................................................. G01R 13/30
[52] U.S. Cl. ..................................... 315/377; 328/189
[58] Field of Search ................. 315/377; 328/189, 188

[56] References Cited

U.S. PATENT DOCUMENTS

| 3,427,536 | 2/1969 | Wainwright | 328/189 |
| 3,441,843 | 4/1969 | Wainwright | 328/189 |
| 3,859,607 | 1/1975 | Brazelton | 328/189 |

FOREIGN PATENT DOCUMENTS 584,567  10/1959  Canada .............................. 328/189

Primary Examiner—Maynard R. Wilbur
Assistant Examiner—T. M. Blum
Attorney, Agent, or Firm—Robert S. Hulse

[57] ABSTRACT

A diamond marker generator circuit generates a diamond-shaped marker making a spot or point on a curve of an input signal being measured.

Despite changes in the display or sweep rate of the input signal, the marker's size is kept constant, and its intensity or contrast is maintained at a constant level relative to the intensity of the curve.

One marker is generated above the curve to mark a current point of interest to a user. One or more markers are generated below the curve to mark previous points of interest.

15 Claims, 15 Drawing Figures

Figure 3A
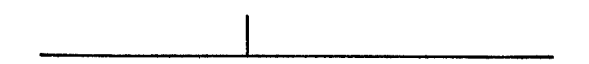
Figure 3B
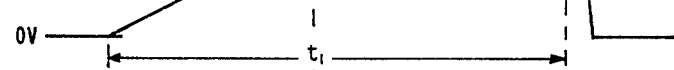
Figure 3C

METHOD AND CIRCUIT FOR GENERATING DIAMOND MARKERS

BACKGROUND OF THE INVENTION

Typically, when the user of an oscilloscope network analyzer, spectrum analyzer, or other signal measuring device selects a spot on a curve of an input signal being measured, a trigger signal is generated corresponding to the location or position of the spot, and a dot, pip, birdie or intensity-type marker is generated at the spot on the curve coincident with the trigger signal. For example, a device that generates one such marker is described in U.S. Pat. No. 3,596,193 entitled "Sweep Oscillator with Intensity Frequency Marker", issued July 27, 1971 to inventor Duane Edmond Dunwoodie.

A problem with intensity-type markers is that, in order to generate a marker of greater intensity than that of the trace or curve of an input signal being measured, it is often necessary to briefly modify the slope of a control signal, namely, the linear ramp signal to the X-deflection axis of the CRT display of the marker device. This introduces transients, and causes errors in the measurement of the input signal at the location of the marker.

Pip and birdie markers, also briefly described in the above-mentioned patent at page 2, column 1, are often difficult to identify when the curve representing the input signal being measured includes numerous high frequency components or noise spikes, or when the sweep rate is high or the curve is moving principally in the direction of the pip or birdie. An additional disadvantage of birdie markers is that the size of these markers often depends on the signal strength of the signals combined to produce the birdie, the legibility of the birdie decreasing when such signal strength is weak. Dot markers are also difficult to identify and distinguish from the curve because they are usually placed in the curve itself and not apart from it, e.g., above or below the curve.

SUMMARY OF THE INVENTION

Thus, in accordance with the illustrated preferred embodiment of the present invention, there is provided a diamond marker generator circuit which generates a selected number of diamond-shaped markers above and below selected spots of a curve. By virtue of being diamond-shaped and placed above or below a curve, the markers are easily identifiable and distinguishable from the curve without the need for intensification. A primary marker is generated above the curve; secondary markers are generated below the curve. A primary marker indicates a currently selected spot of the curve being measured. Secondary markers indicate previously selected spots of the curve that were measured.

The circuit of the present invention also maintains the relation contrast of the markers to the curve at a constant level, proportional to the sweep rate of the input signal. This is accomplished despite changes in the sweep rate of the input signal.

BRIEF DESCRIPTION OF THE DRAWINGS

FIGS. 3A and 3B are waveform diagrams illustrating a trigger signal and an input sweep ramp signal, respectively, that are applied to the circuit of FIG. 2.

FIG. 3C is a waveform diagram of a signal generated to specify the time period or duration required to generate one diamond marker.

DESCRIPTION OF THE PREFERRED EMBODIMENT

Figure 1:
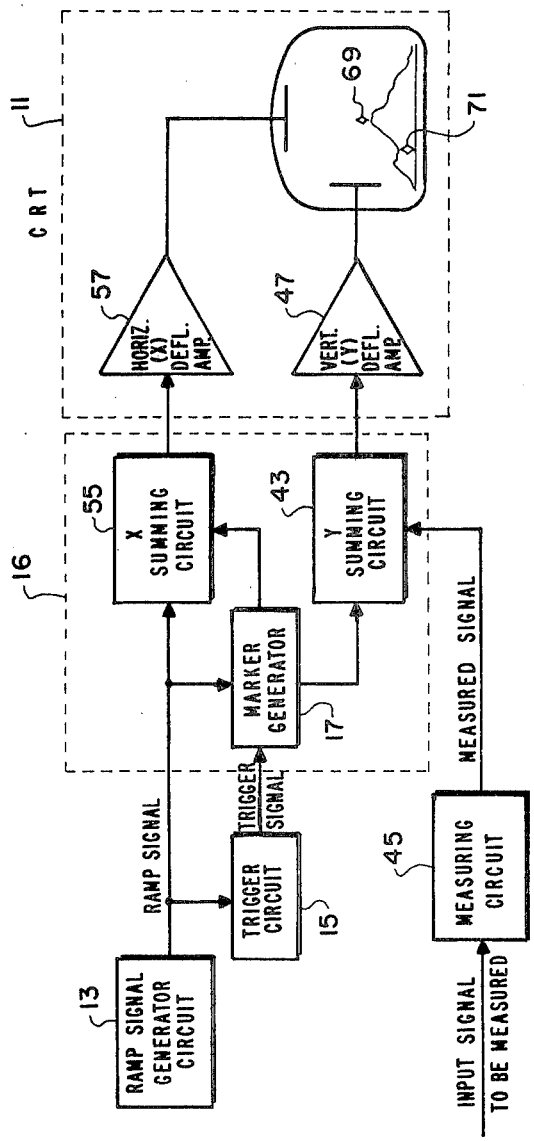
FIG. 1 is a block diagram of a signal measuring device incorporating the diamond marker generator circuit of the present invention.

Frequently, to analyze or test a network or otherwise measure the frequency, phase or other characteristics of a signal, a network analyzer, spectrum analyzer, oscilloscope or other signal-measuring device is used. As FIG. 1 shows, these devices generally include a cathode ray tube (CRT) display 11 for displaying the signal being measured as a curve or trace on the CRT screen, and include circuitry 13 for generating a linear sweep ramp signal to control the CRT beam sweep rate. Also, to permit a user to specify a particular spot of the signal to be measured, these devices generally include a trigger circuit 15 for generating a trigger signal such as that shown in FIG. 3A, to specify the elapsed time or horizontal location of the selected spot (i.e., the location along the X-deflection axis of the CRT display).

Figure 2:
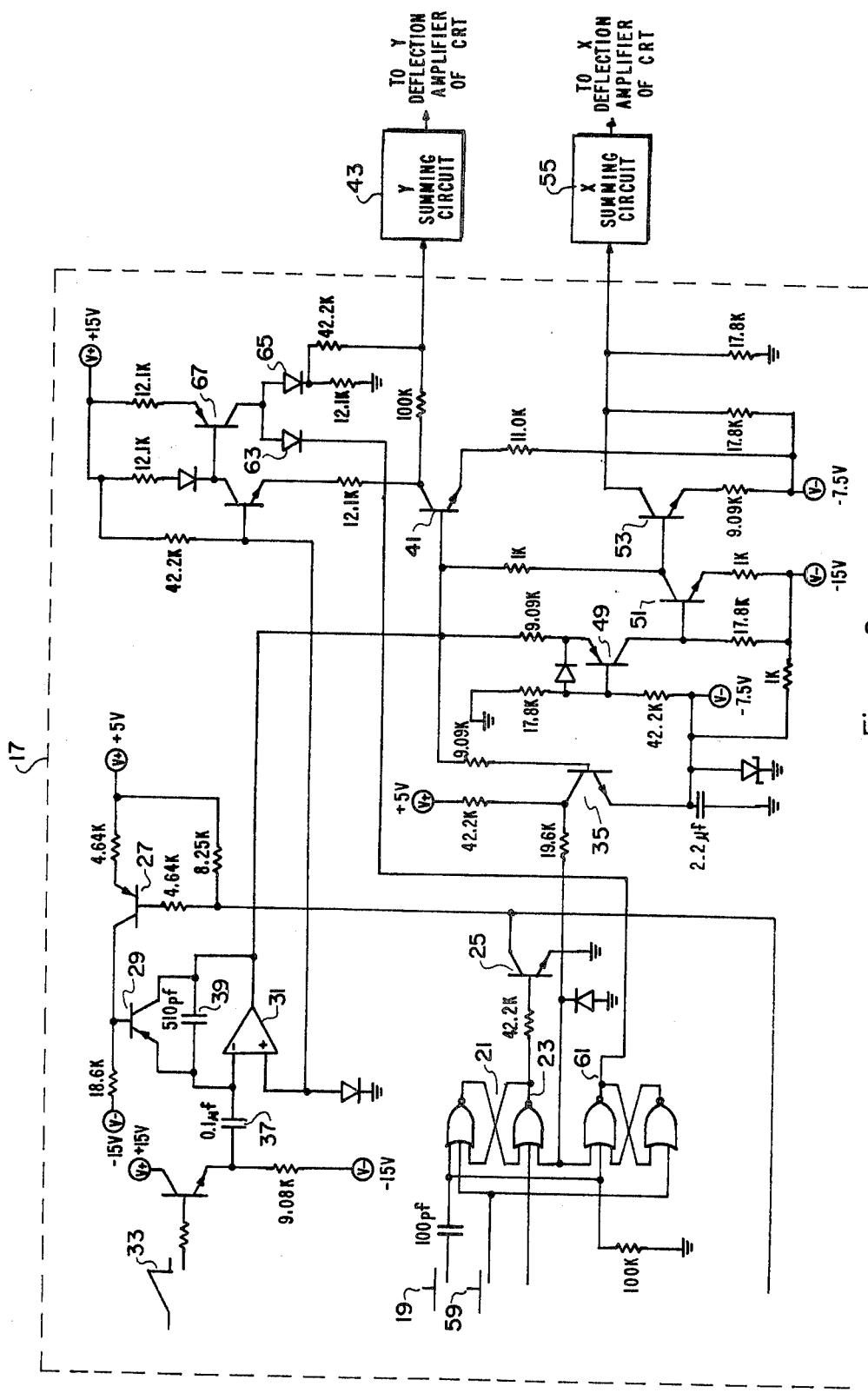
FIG. 2 is a schematic and block diagram of the circuit of the present invention.

According to the preferred embodiment of the present invention, these signal-measuring devices may also be made to include a diamond marker generator circuit 16 to mark selected spots of a display signal. FIG. 2 shows such a diamond marker circuit 16 comprising marker generator 17 and X and Y summing circuits 43 and 55. Trigger and sweep ramp signals are applied to circuit 16 for producing diamond-shaped symbols to mark selected spots of input signals applied to the device for measurement.

When a trigger signal 19 is applied to a latch 21, this causes the output of latch 21 at a lead 23 to go high turning on a transistor 25 and decreasing the voltage on the collector of this transistor. This in turn causes the voltage on the collector of a transistor 27 connected to transistor 25 to increase and the base voltage of transistor 29 to also increase. Thereupon, transistor 29, which is also connected to transistor 27, turns off, causing the output of an operational amplifier 31 to go from +0.07 volts to −6 volts within a time $t_2$ (hereinafter explained), when an input sweep ramp signal 33 is applied. FIG. 3B shows a typical X-deflection sweep ramp signal such as the sweep ramp of an oscilloscope. When the output of amplifier 31 reaches −6 volts, a transistor 35 connected to latch 21 becomes unsaturated from a normally saturated state and the collector of this transistor goes high, resetting latch 21 and thereby turning on transistor 29, which causes operational amplifier 31 to be clamped and its output to return to the +.7 level. This variation in the output of operational amplifier 31 from +.7 to −6 volts and back to +.7 volts when a trigger signal 19 is applied, is shown by the sawtooth curve of FIG. 3C. The width ($t_2$) of the sawtooth curve shown in FIG. 3C represents the time period during which one diamond marker is generated. This time $t_2$ is directly proportional to time period $t_1$ of the sweep ramp, as shown below:

$$\frac{-6.7}{t_2} = \frac{13}{t_1} A$$

where, $-6.7/t_2$ represents the slope of the sawtooth curve shown in FIG. 3C, $13/t_1$ represents the slope of the sweep ramp shown in FIG. 3B, and A represents the gain of operational amplifier 31, expressable as $-C_{10}/C_{11}$ where $C_{10}$ represents the capacitance of capacitor 37 and $C_{11}$ represents the capacitance of capacitor 39. Alternatively, from the above, $t_2$ may be expressed as:

$$t_2 = \frac{-6.7}{13.4} t_1$$

Thus, it can be seen that marker generation time $t_2$ is directly proportional and bears a constant relationship to sweep time $t_1$.

Figure 4A:
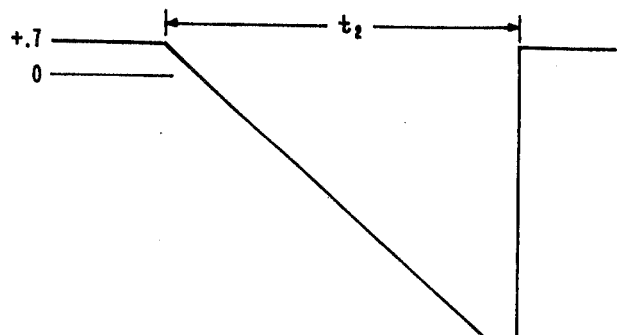
FIG. 4A is an expanded view of the waveform diagram of FIG. 3C.
Figure 4B:
FIGS. 4B-J are waveform diagrams illustrating output signals that are generated at selected points of the circuit of FIG. 2.
Figure 4C:

The output signal from amplifier 31 is applied to the base of a transistor 41, representing a vertical signal shaper means. This signal, shown in FIG. 3C, is depicted in expanded form in FIG. 4A. The output signal from the collector of transistor 41 is shown in FIG. 4B. Transistor 41 is biased such that when its base voltage is in the range from approximately 0 to $-3$ volts during the first half of period $t_2$, transistor 41 becomes saturated, and when its base voltage is in the range from $-3$ to $-6$ volts during the second half of period $t_2$, transistor 41 becomes unsaturated and behaves much like a linear amplifier with a gain of minus one. The output signal from the collector of transistor 41 is then applied to a Y-summing circuit 43 (FIG. 1). This output signal from transistor 41 represents a phased vector component of a diamond-shaped marker symbol along a vertical coordinate axis. Of course, in addition to representing diamond-shaped marker symbols such an output signal may be generated to represent selected symbols including triangles, rhomboids or circles. Y-summing circuit 43 inverts the signal as shown in FIG. 4C and sums the inverted signal and the output signal from measuring circuit 45 (FIG. 1) to produce a vertical deflection signal. This vertical deflection signal is then applied to a vertical or Y-deflection amplifier 47 of CRT 11 to produce the vertical coordinates of the marker symbol being displayed.

Figure 4D:
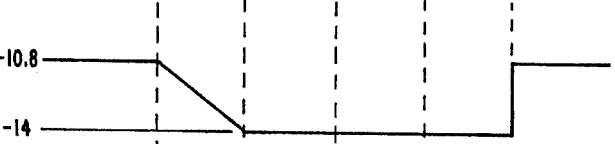
Figure 4E:
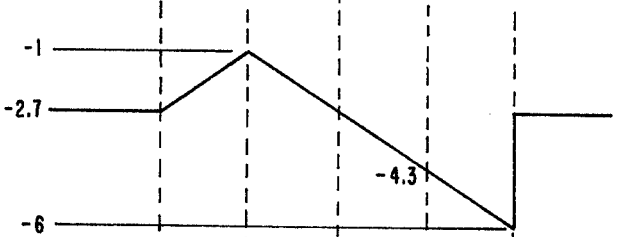
Figure 4F:
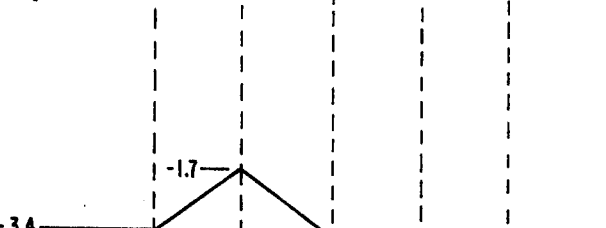
Figure 4G:
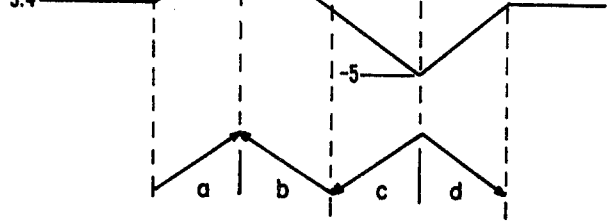

As FIG. 2 shows, the output signal from amplifier 31 is also applied to a transistor 49. This transistor 49 together with transistors 51 and 53, described following, represent a horizontal signal shaper means. The output signal from the collector of transistor 49 is shown in FIG. 4D. This output signal is applied to the base of a transistor 51. Transistor 49 is biased such that when its base voltage is approximately $-14$ volts, it turns off. The output signal from the collector of transistor 51 is shown in FIG. 4E. Transistor 51 inverts the output signal from transistor 49 until minus one volt is reached, and turns off when transistor 49 turns off, thereby following (from $-1$ to $-6$ volts) the remainder of the output signal from amplifier 31 that is also applied to the collector of transistor 51. The output signal from the collector of transistor 51 is applied to the base of a transistor 53. The output signal from the collector of transistor 53 is shown in FIG. 4F. Transistor 53 is biased such that it becomes saturated and follows the input of the applied signal until the input signal reaches $-4.3$ volts, at which point transistor 53 becomes unsaturated and behaves much like a linear amplifier with a gain of minus one. The output signal from the collector of transistor 53, which represents a phased vector horizontal component of the marker symbol, is then applied to an X-summing circuit 55 (FIG. 1) that drives an X-deflection amplifier 57 of CRT 11 to produce the horizontal coordinates of the marker symbol being displayed. Taken together, therefore, the output signals from summing circuits 43 and 55 are utilized by deflection amplifiers 47 and 57 to produce the resultant vector segments shown in FIG. 4G and to form the completed diamond marker shown in FIG. 4H. The arrowheads and the letters a, b, c and d are added merely to show the order in which the individual vector segments are drawn. When no marker symbol is to be displayed, i.e., when only the signal being measured is to be displayed, no output signals are applied by marker generator 17 to summing circuits 43 and 55.

A user of a signal measuring instrument may manually select or otherwise specify more than one spot of a signal to be marked and measured. In this event, more than one trigger signal is usually generated by a trigger circuit 15 to designate a current or primary spot to be measured and one or more previous or secondary spots that were measured. A primary trigger signal is generated to designate the current spot and secondary trigger signals are generated to designate previous spots.

Figure 4H:
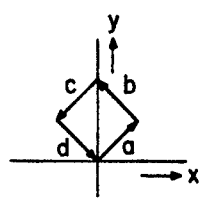
Figure 4I:
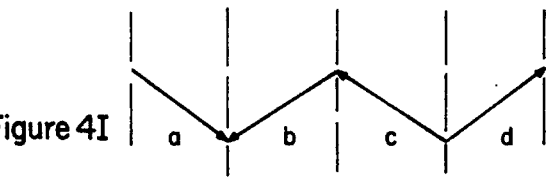
Figure 4J:
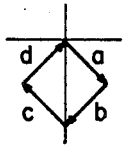

As FIGS. 1 and 2 show, diamond marker generator circuit 16 provides for receiving such trigger signals, and for generating a diamond marker above the curve or waveform of the signal being measured when a primary trigger signal 19 is received, and also for generating a diamond marker below the curve when a secondary trigger signal 59 is received. When a primary trigger signal 19 is applied to latch 21 of marker generator 17, this causes the output (control) signal at lead 61 to go "low", thereby turning "on" diode 63 and turning "off" diode 65, and shunting the output from transistor 67 through diode 63. This causes the shape of the output signal from the collector of transistor 41 to remain substantially unchanged so that when this output signal and the signal being measured are summed by Y-summing circuit 43 (FIG. 1), and the output signal from this circuit 43 is applied to vertical deflection amplifier 47, a diamond marker is produced as shown in FIG. 4H, displayed above the curve of the signal being measured as shown by marker 69 in FIG. 1. When a secondary trigger signal 59 is applied to latch 21 of marker generator 17, this causes the output (control) signal at lead 61 to go "high", thereby turning "off" diode 63 and turning "on" diode 65. This, in turn, causes the output signal from transistor 67, via diode 65, to be combined with the output signal from the collector of transistor 41, thereby producing a resultant inverted output signal as shown in FIG. 4I. Subsequently, when this inverted output signal and the signal being measured are summed by Y-summing circuit 43 (FIG. 1) and the output signal from this circuit 43 is applied to vertical deflection amplifier 47, a diamond marker is produced as shown in FIG. 4J, displayed below the curve of the signal being measured as shown by marker 71 in FIG. 1.

I claim:

1. In a system having an X input and a Y input for displaying on coordinate axes a composite waveform of first and second signals applied to the system, a display marker circuit for generating a symbol marking a spot on the displayed waveform in response to an applied trigger signal, the display marker circuit comprising:

a marker generator coupled to receive the trigger signal and the second signal for producing first and second marker signals representing phased vector components of the marker symbol along the coordinate axes respectively, said first and second marker signals having a duration proportional to and substantially less than the duration of said second signal;

a first summation means having a first input coupled to receive the first signal, a second input coupled to receive the first marker signal and an output coupled to the Y input for applying to said Y input the algebraic combination of the first signal and the first marker signal; and a second summation means having a first input coupled to receive the second signal, a second input coupled to receive the second marker signal and an output coupled to the X input for applying to said X input the algebraic combination of the second signal and the second marker signal.

2. The circuit as in claim 1 wherein said marker generator includes a trigger signal means connected to receive said trigger signal for producing a control signal.

3. The circuit as in claim 2 wherein said second signal is a sweep ramp signal with a preselected sweep time and said marker generator includes amplifier means connected to receive said ramp signal and to receive said control signal from said trigger signal means for generating a marker-duration signal in response to said control signal.

4. The circuit as in claim 3 wherein said marker generator includes a vertical signal shaper means connected to said trigger signal means and to said amplifier means for producing said first marker signal in response to said marker-duration signal.

5. The circuit as in claim 4 wherein said marker generator includes a horizontal signal shaper means connected to said trigger signal means and to said amplifier means for producing said second marker signal in response to said marker-duration signal.

6. The circuit as in claim 5 wherein said display is a CRT, the Y input is the vertical deflection axis of the CRT, and said first summation means is a vertical summing means coupled to said vertical signal shaper means to receive said first signal for applying a vertical deflection signal to said vertical deflection axis.

7. The circuit as in claim 6 wherein the X input is the horizontal deflection axis of the CRT and said second summation means is a horizontal summing means coupled to said horizontal signal shaper means and to receive said ramp signal for applying a horizontal deflection signal to the said horizontal deflection axis.

8. The circuit as in claim 7 wherein said vertical and horizontal summing means coupled to said vertical and horizontal deflection axes apply deflection signals to the CRT for producing a display of diamond-shaped marker symbols.

9. The circuit as in claim 8 wherein said trigger signal means is responsive to a first trigger signal for causing the CRT to display a diamond-shaped marker symbol above a spot of the waveform being displayed, and responsive to a second trigger signal for causing the CRT to display a diamond-shaped marker symbol below a spot of the waveform being displayed.

10. In a system having an X input and a Y input for displaying on coordinate axes a composite waveform of first and second applied signals, the method of generating a symbol marking a spot on the displayed waveform in response to an applied trigger signal, the method comprising the steps of:

producing first and second marker signals in response to the trigger signal and the second signal, the first and second marker signals having a duration proportional to and substantially less than the duration of said second signal, said marker signals representing phased vector components of the marker symbol along first and second coordinate axes respectively;

combining the first and second applied signals with the first and second marker signals, respectively, to form first and second combination signals; and applying the first and second combination signals to the Y and X inputs, respectively, to produce a marker symbol.

11. The method of claim 10 where the step of producing first and second marker signals includes the steps of:

producing a control signal in response to the trigger signal;

generating a marker-duration signal in response to the second applied signal and the control signal;

producing a first marker signal in response to the marker-duration signal; and producing a second marker signal in response to the marker-duration signal.

12. The method of claim 10 where the step of combining signals includes the steps of:

summing the first applied signal and the first marker signal algebraically to form the first combination signal; and summing the second applied signal and the second marker signal algebraically to form the second combination signal.

13. The method of claim 12 where the step of summing the first applied and first marker signals to form the first combination signal includes the step of adjusting the summing operation to provide for display of the marker symbol above the waveform when a first trigger signal is applied, and below the waveform when a second trigger signal is applied.

14. The method of claim 10 where the Y input is a vertical deflection axis of a CRT, the X input is a horizontal deflection axis, the second applied signal is a ramp signal, and the step of applying combination signals to the coordinate axes includes the steps of:

applying the first combination signal as a vertical deflection signal to the vertical deflection axis; and applying the second combination signal as a horizontal deflection signal to the horizontal deflection axis.

15. The method of claim 10 where the step of producing marker signals includes generating marker signals for producing diamond-shaped marker symbols.

* * * * *

UNITED STATES PATENT AND TRADEMARK OFFICE
CERTIFICATE OF CORRECTION

PATENT NO. : 4,092,567
DATED : May 30, 1978
INVENTOR(S) : David D. Sharrit

It is certified that error appears in the above-identified patent and that said Letters Patent are hereby corrected as shown below:

In the Abstract, second line, "making" should read -- marking --;

Column 1, line 58, "relation" should read -- relative --;

Column 2, line 49, "+0.07" should read -- +.7 --.

Signed and Sealed this

Twenty-second Day of May 1979

[SEAL]

Attest:

RUTH C. MASON
Attesting Officer

DONALD W. BANNER
Commissioner of Patents and Trademarks